US007675125B2

(12) United States Patent
Park et al.

(10) Patent No.: US 7,675,125 B2
(45) Date of Patent: Mar. 9, 2010

(54) NAND-TYPE NONVOLATILE MEMORY DEVICE AND RELATED METHOD OF MANUFACTURE

(75) Inventors: Hyun-Mog Park, Seongbuk-gu (KR); Seung-Jun Lee, Suwon-si (KR); Hyun-Jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 280 days.

(21) Appl. No.: 11/651,543

(22) Filed: Jan. 10, 2007

(65) Prior Publication Data
US 2008/0079091 A1  Apr. 3, 2008

(30) Foreign Application Priority Data
Oct. 2, 2006  (KR)  ............... 10-2006-0097315

(51) Int. Cl.
  *H01L 27/115* (2006.01)
(52) U.S. Cl. .......... 257/390; 257/315; 257/E29.3
(58) Field of Classification Search ........ 257/536, 257/315, 390, E29.3
  See application file for complete search history.

(56) References Cited

U.S. PATENT DOCUMENTS

| | | | | |
|---|---|---|---|---|
| 5,554,873 A | * | 9/1996 | Erdeljac et al. | ............ 257/380 |
| 6,300,653 B1 | * | 10/2001 | Pan | ............ 257/296 |
| 6,376,881 B1 | * | 4/2002 | Nagaya | ............ 257/355 |
| 6,867,453 B2 | * | 3/2005 | Shin et al. | ............ 257/314 |
| 7,119,440 B2 | * | 10/2006 | Huang | ............ 257/751 |
| 7,151,314 B2 | * | 12/2006 | Maneki | ............ 257/750 |
| 7,190,022 B2 | * | 3/2007 | Shum et al. | ............ 257/316 |
| 2003/0127705 A1 | * | 7/2003 | Kwak et al. | ............ 257/536 |
| 2003/0178697 A1 | * | 9/2003 | Lee et al. | ............ 257/536 |
| 2004/0042272 A1 | * | 3/2004 | Kurata | ............ 365/185.33 |
| 2004/0212008 A1 | * | 10/2004 | Hasegawa | ............ 257/316 |

FOREIGN PATENT DOCUMENTS

| | | |
|---|---|---|
| JP | 2003-273213 | 9/2003 |
| KR | 100270955 | 8/2000 |
| KR | 1020040067212 A | 7/2004 |
| KR | 1020040076300 | 9/2004 |
| KR | 1020050108987 A | 11/2005 |
| KR | 1020060007177 A | 1/2006 |

* cited by examiner

*Primary Examiner*—Davienne Monbleau
*Assistant Examiner*—Eduardo A Rodela
(74) *Attorney, Agent, or Firm*—Volentine & Whitt, PLLC

(57) ABSTRACT

In a NAND type nonvolatile memory device, a first insulating layer covers a common drain region formed in a string active region and a peripheral active region. A second insulating layer covers the first insulating layer. A bit line plug penetrates the first and second insulating layers and is connected to the common drain region. A peripheral lower plug penetrates the first insulating layer and is connected to the peripheral active region. A peripheral upper plug penetrates the second insulating layer and is stacked on the peripheral lower plug.

18 Claims, 11 Drawing Sheets

NAND-TYPE NONVOLATILE MEMORY DEVICE AND RELATED METHOD OF MANUFACTURE

BACKGROUND OF THE INVENTION

1. Field of the Invention

Embodiments of the invention relate generally to semiconductor memory devices and related methods of manufacture. More particularly, embodiments of the invention relate to NAND-type nonvolatile semiconductor memory devices and related methods of manufacture.

A claim of priority is made to Korean Patent Application No. 2006-97315 filed on Oct. 2, 2006, the disclosure of which is hereby incorporated by reference in its entirety.

2. Description of Related Art

Nonvolatile memory devices are capable of retaining stored data even when disconnected from an external power source. Among nonvolatile memory devices, flash memory is one of the more popular types due at least in part to its ability to be electrically programmed and erased, its relatively high degree of integration, resistance to physical stress, and low power consumption.

Two common forms of flash memory include NOR-type flash memory and NAND type flash memory. NOR type flash memory provides high-speed random-access, and therefore NOR type flash memories are often used in applications requiring fast read performance. For example, NOR flash memories are commonly used to store microcode for controlling devices. NAND-type flash memories, on the other hand, tend to have a relatively higher level of integration and program/erase performance than NOR flash memories, and therefore NAND flash memories are often used, for example, to provide mass data storage.

A NAND type flash memory comprises a plurality of cell strings, where each cell string comprises a plurality of flash memory cells connected in series. Each cell string is connected at one end to a common drain region via a bit line and at another end to a common source region. The common drain region provides each cell string with a voltage used for programming, erasing and/or sensing operations. The common source region provides a reference voltage used in the programming, erasing and/or sensing operations.

NAND type flash memory devices are typically formed through a large number of processing operations. Among these operations, there are usually steps for depositing various layers on a substrate and other intermingled steps for creating various openings such as grooves, holes, and trenches in the various layers and in the substrate. The openings can be formed with a variety of sizes and shapes, e.g., with a large plane area and/or a small plane area. At least some of the openings will generally penetrate insulators to expose underling conductors. Other conductors can then be formed in the openings to electrically connect the underlying conductors with other features in the NAND type flash memory devices.

Proper formation of the openings tends to require very precise processing conditions. Moreover, different types, shapes, and sizes of openings tend to require different processing conditions. Unfortunately, if required processing conditions for a particular opening are not precisely met, the opening may not be properly formed. For example, the opening may not adequately expose underlying features, or the opening may be formed wider than a desired width, creating possible electrical shorts.

As the degree of integration in NAND type flash memory devices increases to new levels, line widths in the devices tend to decrease accordingly and the depths of the openings tends to increase accordingly. Unfortunately, however, conventional manufacturing techniques are not well suited to forming openings with the dimensions required for next generation NAND type flash memory devices.

SUMMARY OF THE INVENTION

According to one embodiment of the invention, a NAND type flash memory device comprises a substrate comprising a memory region and a peripheral region. A device isolation layer is formed in the substrate to define a string active region extending in a first direction within the memory region and to define a peripheral active region extending in the first direction within the peripheral region. A common source region and a common drain region are formed in the string active region such that the common source region and the drain region are separated from each other. A first insulating layer is formed on the substrate and having a source groove. A source line is formed to fill the source groove such that the source line is connected to the common source region. A peripheral lower plug penetrates the first insulating layer and is connected to the peripheral active region. A second insulating layer is formed on the substrate over the first insulating layer and the peripheral lower plug. A peripheral upper plug penetrates the second insulating layer and is connected to the peripheral lower plug, and a bit line plug penetrates the first and second insulating layers and is connected to the common drain region.

According to another embodiment of the invention, a method of forming a NAND type nonvolatile memory device comprises forming a device isolation layer in a substrate to define a string active region extending in a first direction in a memory region of the substrate and to further define a peripheral active region in a peripheral region of the substrate. The method further comprises forming a common source region and a common drain region in the string active region, the common source and drain regions being separated from each other, and forming a first insulating layer to cover an entire surface of the substrate. The method still further comprises patterning the first insulating layer to form a source groove exposing the common source region and a peripheral lower contact hole exposing the peripheral active region. The method further comprises forming a source line filling the source groove and a peripheral lower plug filling the peripheral lower contact hole, and forming a second insulating layer to cover an entire surface of the substrate. The method still further comprises forming a bit line contact hole penetrating the first and second insulating layers to expose the common drain region and a peripheral upper contact hole penetrating the second insulating layer to expose the peripheral lower plug, and forming a bit line plug filling the bit line contact hole and a peripheral upper plug filling the peripheral upper contact hole.

BRIEF DESCRIPTION OF THE DRAWINGS

Embodiments of the invention are described in this written description with reference to the accompanying drawings. Throughout the drawings like reference numbers indicate like exemplary elements, components, and steps. In addition, the dimensions of layers, regions, and other features have been exaggerated for illustration purposes. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In this written description, it should be understood that when one feature such as a layer or film is referred to as being "on" another feature such as another layer or a substrate, the one feature may be directly on the other feature, or intervening features may also be present. It should be further understood that when one feature such as a layer is referred to as being "under" another layer, the one feature can be directly under the other feature, or intervening features may be present. It should be still further understood that when one feature such as a layer is referred to as being "between" two other features, the one feature may be in direct contact with the other two features, or intervening features may be present.

Figure 1:
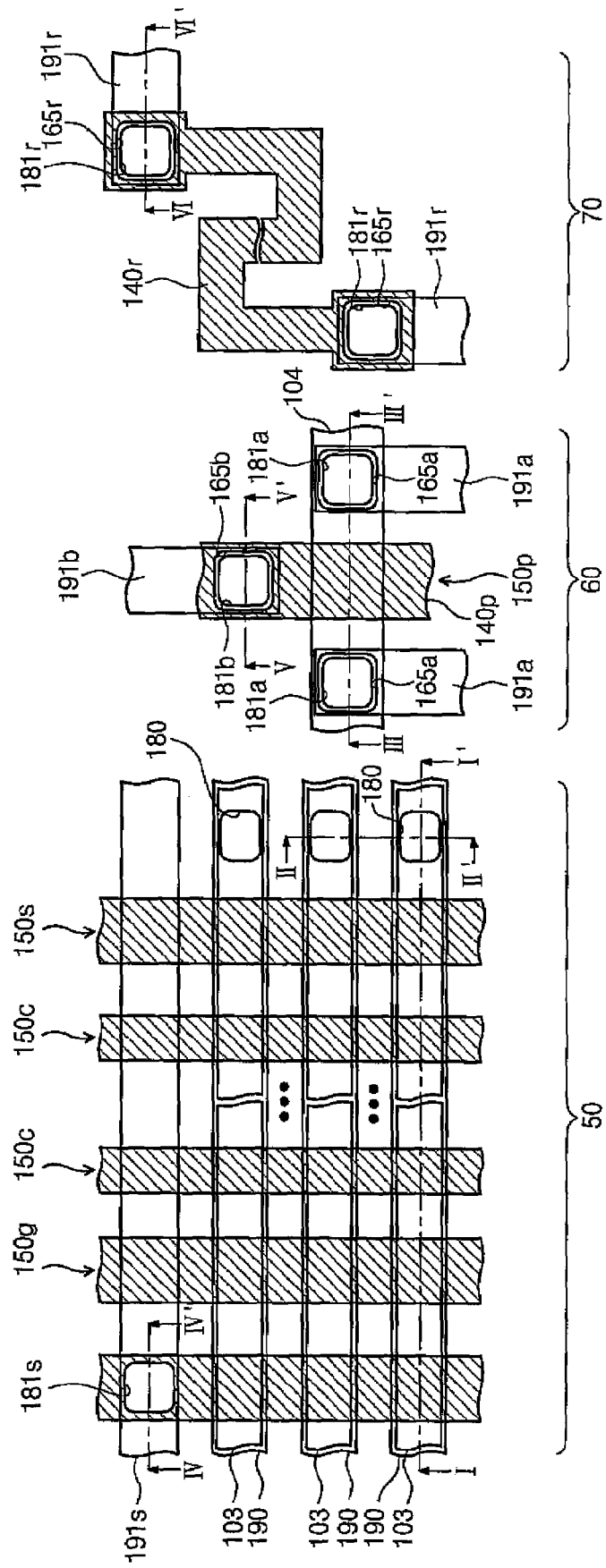
FIG. 1 is a plan view of a NAND type flash memory device according to one embodiment of the present invention.
Figure 2A:
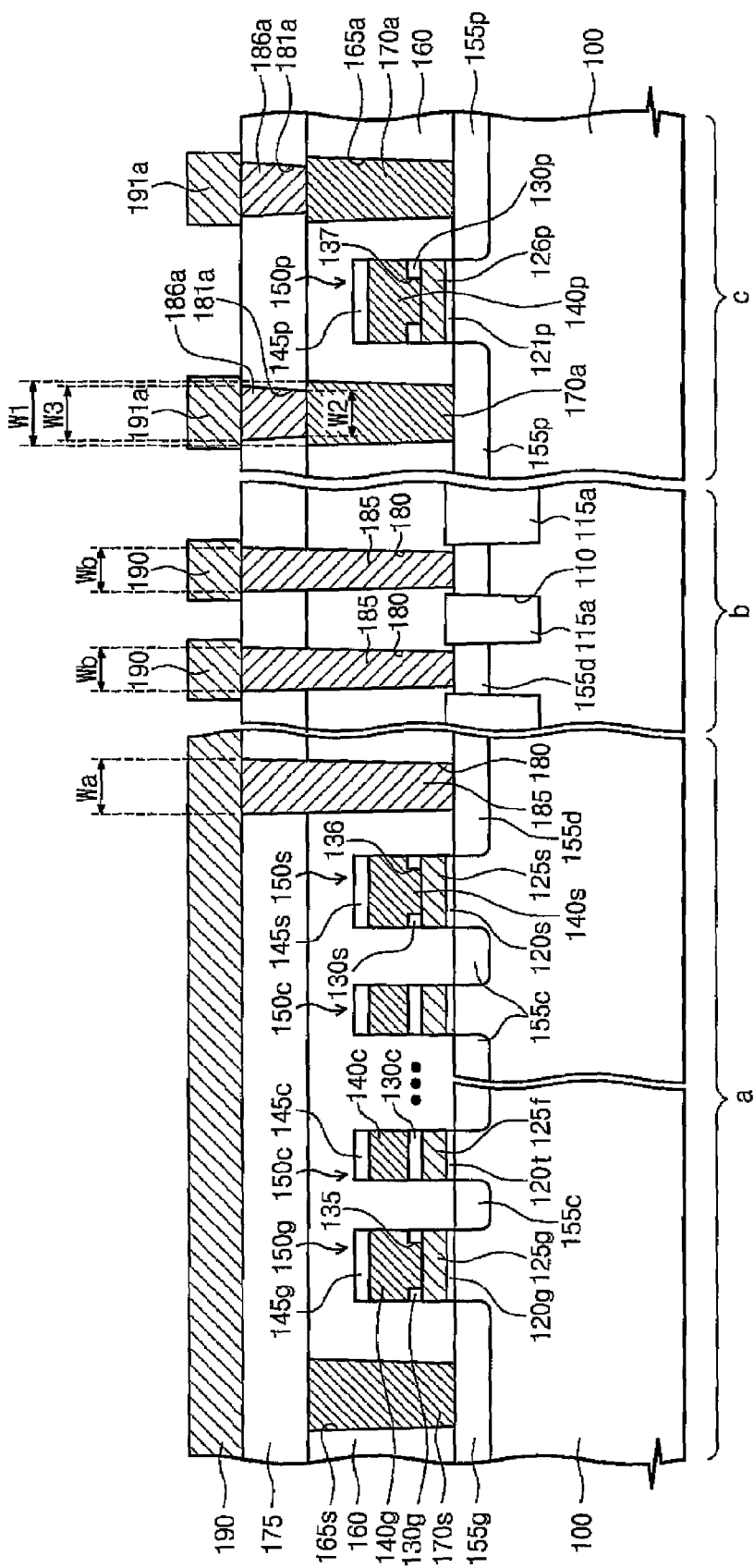
FIG. 2A shows three different sectional views taken along lines I-I', II-II', and II-III' in FIG. 1, respectively.
Figure 2B:
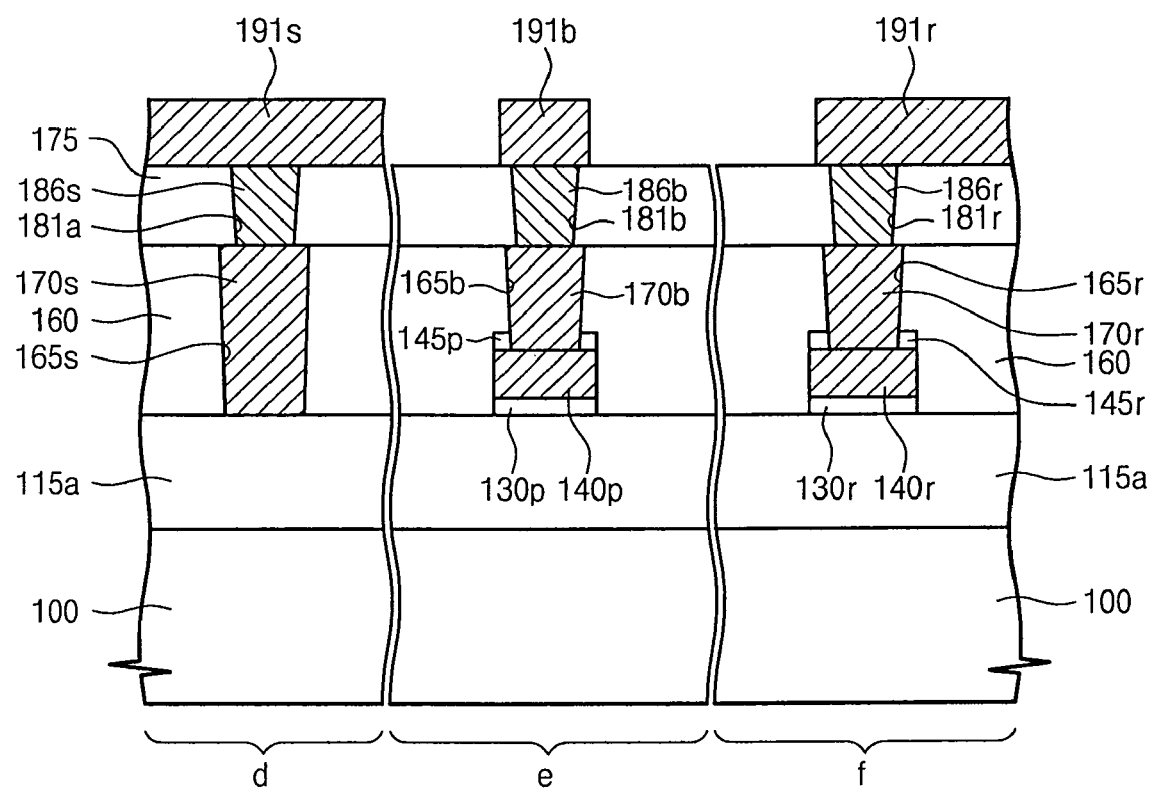
FIG. 2B shows three different sectional views taken along lines IV-IV', V-V' and VI-VI' in FIG. 1, respectively.

FIG. 1 is a plan view of a NAND type flash memory device according to an embodiment of the present invention. FIG. 2A shows three sectional views taken along lines I-I', II-II' and III-III' in FIG. 1, respectively, and FIG. 2B shows three sectional views taken along lines IV-IV', V-V' and VI-VI' of FIG. 1, respectively. In FIG. 2A, reference symbols "a", "b" and "c" denote sectional views taken along the lines I-I', II-II' and III-III' of FIG. 1, respectively. In FIG. 2B, reference symbols "d", "e" and "f" denote sectional views taken along the lines IV-IV', V-V' and VI-VI' of FIG. 1, respectively.

Referring to FIG. 1 and FIGS. 2A and 2B, a device isolation layer 115a is formed on a semiconductor substrate 100 including a memory region 50, a peripheral region 60, and a resistor region 70. Device isolation layer 115a is a trench device isolation layer filling a trench 110 formed in substrate 100.

Device isolation layer 115a defines a plurality of string active regions 103 in memory region 50. String active regions 103 extend in a first direction on substrate 100 in memory region 50. String active regions 103 are formed in parallel with each other and separate from each other.

Device isolation layer 115a also defines a peripheral active region 104 in peripheral region 60. In addition, device isolation layer 115a is formed on substrate 100 in resistor region 70. Preferably, each string active region 103 has a smaller width than each peripheral active region 104, where the width of each string active region 103 and the width of each peripheral active region 104 are measured in a second direction perpendicular to the first direction.

A common source region 155g and a common drain region 155d are formed in each string active region 103. The common source region 155g and the drain region 155d in each string active region 103 are separated from each other. Common source regions 155g formed in respective string active regions 103 are arranged in a first column along the second direction. Similarly, common drain regions 155d formed in respective string active regions 103 are arranged in a column along the second direction.

A first select gate line 150g and a second select gate line 150s, which are parallel with each other, cross over string active regions 103 between each common source region 155g and the corresponding common drain region 155d. First select gate line 150g is adjacent to common source regions 155g, and second select gate line 150s is adjacent to common drain regions 155d.

A plurality of cell gate lines 150c, which are parallel with each other, cross over string active regions 103 between common source regions 155g and common drain regions 155d. Cell gate lines 150c are separated from each other, and are arranged in parallel with first and second select gate lines 150g and 150s.

Cell source/drain regions 155c are formed in each string active region 103 at either side of each cell gate line 150c. First select gate line 150g is formed on string active region 103 between common source region 155g and the cell source/drain region 155c most adjacent to common source region 155g. Second select gate line 150s is disposed on string active region 103 between common drain region 155d and the cell source/drain region 155c most adjacent to common drain region 155d. Common source and drain regions 155g and 155d, and cell source/drain regions 155c are doped with the same type of dopants.

Cell gate line 150c includes a control gate electrode 140c and a floating gate 125f interposed between control gate electrode 140c and string active region 103. Control gate electrode 140c and floating gate 125f have a line shape crossing over string active region 103. In addition, cell gate line 150c further includes a tunnel insulating layer 120t interposed between floating gate 125f and string active region 103, and a blocking insulating pattern 130c interposed between floating gate 125f and control gate electrode 140c. Cell gate line 150c may further include a cell capping pattern 145c formed on control gate electrode 140c.

First select gate line 150g comprises a first select gate electrode. The first select gate electrode comprises a first upper gate 140g having a line shape crossing over string active region 103 and a first lower gate 125g interposed between first upper gate 140g and string active region 103. First selection gate line 150g may further comprise a first selection gate insulating layer 120g interposed between first lower gate 125g and string active region 103. In addition, first select gate line 150g may further comprise a first select interlayer pattern 130g interposed between first lower and upper gates 125g and 140g. Here, first upper gate 140g fills a first select opening 135 penetrating first select interlayer pattern 130g so that first upper gate 140g is connected to first lower gate 125g. First select gate line 150g may further include a first select capping pattern 145g disposed on first upper gate 140g.

Second select gate line 150s includes a second select gate electrode. Second select gate electrode 150s includes a second upper gate 140s and a second lower gate 125s interposed between second upper gate 140s and string active region 103, wherein second upper and lower gates 140s and 125s each have a line shape crossing over string active region 103. Second select gate line 150s further comprises a second select gate insulating layer 120s interposed between second lower gate 125s and string active region 103. In addition, second select gate line 150s further comprises a second select interlayer pattern 130s interposed between second lower and upper gates 125s and 140s. Second upper gate 140s fills a second select opening 136 penetrating second select interlayer pattern 130s so that second upper gate 140s is connected to second lower gate 125s. Second select gate line 150s further comprises a second select capping pattern 145s formed on second upper gate 140s.

A peripheral gate pattern 150p crosses over peripheral active region 104. Peripheral source/drain regions 155p are formed in peripheral active region 104 at either side of peripheral gate pattern 150p. Peripheral gate pattern 150p comprises a peripheral gate electrode. The peripheral gate electrode comprises a peripheral upper gate 140p and a peripheral lower gate 126p interposed between peripheral upper gate 140p and peripheral active region 104, wherein peripheral upper and lower gates 140p and 126p cross over peripheral active region 104.

Peripheral gate pattern 150p further comprises a peripheral gate insulating layer 121p interposed between lower peripheral lower gate 126p and peripheral active region 104. Peripheral upper gate 140p extends over device isolation layer 115a in the peripheral region 60 disposed at either side of peripheral active region 104.

Peripheral gate pattern 150p still further comprises a peripheral interlayer pattern 130p interposed between peripheral lower and upper gates 126p and 140p. Peripheral upper gate 140p fills a peripheral opening 137 penetrating peripheral interlayer pattern 130p so that peripheral upper gate 140p is connected to peripheral lower gate 126p. Peripheral interlayer pattern 130p extends and is interposed between an extended portion of peripheral upper gate 140p and device isolation layer 115a. Peripheral source/drain regions 155p are preferably doped with the same type of dopants as cell source/drain regions 155c. Alternatively, peripheral source/drain regions 155p may be doped with a different type of dopants from cell source/drain regions 155c.

A resistor pattern 140r is formed over device isolation layer 115a in resistor region 70. The resistance of resistor pattern 140r depends on its length. Accordingly, the length of resistor pattern 140r can be designed to provide a desired resistance for the NAND type flash memory device. Resistor pattern 140r is typically formed of the same material as control gate electrode 140c. In addition, a resistor interlayer pattern 130r is typically interposed between resistor pattern 140r and device isolation layer 115a and a resistor capping pattern 145r is typically disposed on resistor pattern 140r.

Although not shown, gate spacers may be formed on sidewalls of cell gate line 150c, first and second select gate lines 150g and 150s, and peripheral gate pattern 150p, respectively. Peripheral source/drain regions 155p are typically arranged with a first portion under the gate spacer, and a second portion adjacent to the first portion, wherein the second portion has a greater depth than the first portion. Preferably, the first portion has a dopant concentration less than or equal to a dopant concentration of the second portion.

Tunnel insulating layer 120t, and first and second gate insulating layers 120g and 120s are typically formed of an oxide such as a thermal oxide. First and second select gate insulating layers 120g and 120s preferably have substantially the same thickness and are formed of the same material. Similarly, tunnel insulating layer 120t and first and second select gate insulating layers 120g and 120s preferably have the substantially the same thickness and are formed of the same material. In addition, peripheral lower gate 126p is preferably formed of the same material as floating gate 125f. Floating gate 125f is preferably formed of doped polysilicon.

Blocking insulating pattern 130c is preferably formed of an oxide layer having a greater thickness than tunnel insulating layer 120t. Alternatively, blocking insulating pattern 130c may be formed of an oxide-nitride-oxide (ONO) layer. Moreover, in yet another alternative, blocking insulating pattern 130c may include an insulating material having a higher dielectric constant than tunnel insulating layer 120t. For instance, blocking insulating pattern 130c could include an insulating metal oxide such as hafnium nitride or tantalum nitride. First and second select interlayer patterns 130g and 130s, peripheral interlayer pattern 130p and resistor interlayer pattern 130r are formed of an insulating material. Preferably, interlayer patterns 130g, 130s, 130p and 130r are all formed of the same material as blocking insulating pattern 130c.

Control gate electrode 140c is formed of a conductive material. For example, control gate electrode 140c is often formed of at least one material selected from a group consisting of doped polysilicon, a metal such as tungsten or molybdenum, a conductive metal nitride such as titanium nitride or tantalum nitride, and a metal silicide such as tungsten silicide or cobalt silicide. First and second select upper gates 140g and 140s, and peripheral upper gate 140p are formed of a conductive material. Preferably, upper gates 140g, 140s and 140p are formed of the same material as control gate electrode 140c. The resistance of resistor pattern 140r is determined by its linewidth and length, as described above. Resistor pattern 140r is preferably formed of the same material as control gate electrode 140c.

First select capping pattern 145g, second select capping pattern 145s, cell capping pattern 145c, peripheral capping pattern 145p, and resistor capping pattern 145r are all formed of an insulating material. For instance, capping patterns 145g, 145s, 145c, 145p and 145r are all preferably formed using at least one material selected from a group consisting of oxide, nitride and oxynitride.

Referring to FIG. 1 and FIGS. 2A and 2B, a first interlayer insulating layer 160 is formed on substrate 100 over 150g, 150s and 150c, peripheral gate pattern 150p, resistor pattern 140r and resistor capping pattern 145r. First interlayer insulating layer 160 typically comprises oxide. Capping patterns 145g, 145s, 145c, 145p and 145r are preferably formed of the same material as first interlayer insulating layer 160.

A source line 170s fills a source groove 165s formed in first interlayer insulating layer 160 in memory region 50, and is connected to common source region 155g. Source line 170s, which runs in the second direction, crosses over string active regions 103. Source line 170s is arranged in parallel with gate lines 150g, 150c and 150s. Source line 170s is connected to a plurality of common source regions 155g arranged along the first column. A top surface of source line 170s is preferably coplanar with a top surface of first interlayer insulating layer 160. The width of source line 170s decreases in a downward direction from its top surface. In other words, as seen, for example in FIG. 2B, the sidewalls of source line 170s are tapered.

Source line 170s is formed of a conductive material. For instance, source line 170s typically comprises at least one material selected from a group consisting of doped polysilicon, a metal such as tungsten or molybdenum, a conductive metal nitride such as titanium nitride or tantalum nitride, and a metal silicide such as tungsten silicide or cobalt silicide.

A peripheral lower plug 170a fills a peripheral lower contact hole 165a penetrating first interlayer insulating layer 160 in peripheral region 60. Peripheral lower plug 170a is connected to peripheral source/drain regions 155p. A pair of peripheral lower plugs 170a are formed at opposing sides of peripheral gate pattern 150p. The respective widths of the peripheral lower plugs 170a decrease in a downward direction. Each of peripheral lower plugs 170a has a width W1.

Peripheral lower plugs 170a are preferably formed of the same material as source line 170s.

A peripheral gate lower plug 170b fills a peripheral gate lower contact hole 165b, which sequentially penetrates first interlayer insulating layer 160 and peripheral capping pattern 145p in peripheral region 60. Peripheral gate lower plug 170b is connected to peripheral upper gate 140b. Peripheral gate lower plug 170b has a width that decreases in a downward direction. Peripheral gate lower plug 170b is connected to a portion of peripheral upper gate 140p over device isolation layer 115a. Peripheral gate lower plug 170b is preferably formed of the same material as source line 170s.

A resistor lower plug 170r fills a resistor lower contact hole 165r, which sequentially penetrates first interlayer insulating layer 160 and resistor capping pattern 145r in resistor region 70. Thus resistor lower plug 170r is connected to resistor pattern 140r. A pair of resistor lower plugs 170r are connected to respective opposite ends of resistor pattern 140r. In addition, the respective widths of resistor lower plugs 170r decrease in a downward direction. Resistor lower plug 170r is preferably formed of the same material as source line 170s.

The respective top surfaces of peripheral lower plug 170a, peripheral gate lower plug 170b, and resistor lower plug 170r are preferably coplanar with the top surface of first interlayer insulating layer 160, and therefore coplanar with each other.

A second interlayer insulating layer 175 covers an entire surface of substrate 100. Second interlayer insulating layer 175 is preferably formed of oxide so that it has an etch rate substantially equal to or similar to that of first interlayer insulating layer 160. Alternatively, at least a lower portion of second interlayer insulating layer 175 may be formed of an insulating material having an etch selectivity relative to first interlayer insulating layer 160. For example, the second interlayer insulating layer 175 may be formed entirely of nitride or oxynitride. Alternatively, second interlayer insulating layer 175 may be formed as a bilayer including a nitride layer and an oxide layer or an oxynitride layer and an oxide layer, stacked in sequence.

A bit line plug 185 fills a bit line contact hole 180 sequentially penetrating second and first interlayer insulating layers 175 and 160 in memory region 50. Bit line plug 185 is connected to common drain region 155d. A plurality of bit line plugs 185, which are respectively connected to common drain regions 155d, are disposed in memory region 50.

A top surface of bit line plug 185 has a first width Wa measured in the first direction and a second width Wb measured in the second direction. Preferably, first width Wa is greater than second width Wb. The magnitude of second width Wb depends on the width of string active regions 103, i.e., the width of the top surface of common drain region 155d. The width of string active region 103 may be a minimum linewidth in the device. Therefore, second width Wb may also be the minimum linewidth. Since first width Wa is greater than second width Wb, a contact area between bit line plug 185 and common drain region 155d is increased. As a result, a contact resistance between bit line plug 185 and common drain region 155d may be reduced. That is, the contact area between bit line plug 185 and common drain region 155d is increased by increasing first width Wa but not changing second width Wb depending on the width of string active region 103.

The width of bit line 185 decreases in a downward direction such that the width of the bottom surface of bit line plug 185 measured in the second direction is smaller than second width Wb. As a result, even though both second width Wb and the width of string active region 103 are minimum linewidths, it is possible to secure an alignment margin between bit line plug 185 and common drain region 155d.

Similarly, the width of bit line 185 decreases in a downward direction such that the width of the bottom surface of bit line plug 185 measured in the first direction is smaller than first width Wa. Bit line plug 185 is preferably formed of a conductive material. For example, bit line plug 185 may comprise at least one material selected from a group consisting of doped polysilicon, a metal such as tungsten or molybdenum, a conductive metal nitride such as titanium nitride or tantalum nitride, and a metal silicide such as tungsten silicide or cobalt silicide.

A peripheral upper plug 186a fills a peripheral upper contact hole 181a penetrating second interlayer insulating layer 175 and exposes peripheral lower plug 170a. That is, peripheral lower plug 170a and peripheral upper plug 186a are stacked in sequence and connected to each other. Peripheral upper plug 186a has a bottom surface with a width W2 smaller than width W1. Thus, it is possible to secure an alignment margin between peripheral upper plug 186a and peripheral lower plug 170a. Peripheral upper plug 186a has a top surface with a width W3 smaller than width W1.

The width of peripheral upper plug 186a decreases in a downward direction so that width W3 is greater than width W2. Since width W3 of the top surface of peripheral upper plug 186a is greater than width W2, width W3 may be substantially equal to width W1. Peripheral upper plug 186a is typically formed of the same material as bit line plug 185.

Preferably, second width Wb is smaller than width W1 and first width Wa is smaller than or equal to width W1. Alternatively, to increase a contact area between bit line plug 185 and common drain region 155d, first width Wa may be greater than width W1.

A peripheral gate upper plug 186b fills a peripheral upper contact hole 181b penetrating second interlayer insulating layer 175 and exposing peripheral gate lower plug 170b in peripheral region 60. Therefore, peripheral gate upper plug 186b is connected to peripheral gate lower plug 170b. Preferably, the width of the bottom surface of peripheral gate upper plug 186b is smaller than the width of the top surface of peripheral gate lower plug 170b so that an alignment margin may be secured between peripheral gate upper plug 186b and peripheral gate lower plug 170b.

The width of the top surface of peripheral gate upper plug 186b is preferably smaller than or equal to the width of the top surface of peripheral gate lower plug 170b. Where the widths of the top surfaces of peripheral gate upper plug 186b and peripheral gate lower plug 170b are substantially equal to each other, the sidewalls of peripheral gate upper plug 186b are preferably tapered similar to the sidewalls of peripheral upper plug 186a. Consequently, the bottom surface of the peripheral gate upper plug 186b has a smaller area than the top surface of peripheral gate lower plug 170b. The width of the top surface of peripheral gate upper plug 186b may be equal to width W3. Peripheral gate lower plug 170b is preferably formed of the same material as bit line plug 185.

A source plug 186s fills a source contact hole 181s penetrating second interlayer insulating layer 175 and exposing source line 170s in memory region 50. Therefore, source plug 186s is connected to source line 170s. Preferably, the width of the bottom surface of source plug 186s is smaller than the width of the top surface of source line 170s. The width of the top surface of source plug 186s is preferably smaller than or equal to the width of the top surface of source line 170s. Where the widths of the top surfaces of source plug 186s and source line 170s are equal to each other, the sidewalls of source plug 186s are preferably tapered like the sidewalls of peripheral upper plug 186a so that an alignment margin may be secured between source plug 186s and source line 170s. The width of the top surface of source plug 186s is preferably equal to the width of the top surface of peripheral upper plug 186a. Source plug 186s is preferably formed of the same material as bit line plug 185.

A resistor upper plug 186r fills a resistor upper contact hole 181r penetrating second interlayer insulating layer 175 and exposing resistor lower plug 170r in resistor region 70. Accordingly, resistor upper plug 186r is connected to resistor lower plug 170r. Preferably, the width of the bottom surface of resistor upper plug 186r is smaller than the width of the top surface of resistor lower plug 170r. The width of the top surface of resistor upper plug 186r may be smaller than or equal to the width of the top surface of resistor lower plug 170r. Where the widths of the top surfaces of resistor upper plug 186r and resistor lower plug 170r are equal to each other, it is preferable that the sidewall of the resistor upper plug 186r is tapered like the sidewall of peripheral upper plug 186a. The width of the top surface of resistor upper plug 186r is preferably equal to the width of the top surface of peripheral upper plug 186a. Resistor upper plug 186r is preferably formed of the same material as bit line plug 185.

Top surfaces of upper plugs 186a, 186b and 186r, source plug 186s, bit line plug 185 and second interlayer insulating layer 175 are coplanar with one another. As described above, upper plugs 186a, 186b and 186r, source plug 186s and bit line plug 185 may be formed of the same conductive material. The widths of the upper plugs 186a, 186b and 186r and source plug 186s may be equal to second width Wb. Alternatively, where first width Wa is smaller than or equal to width W1, the widths of upper plugs 186a, 186b and 186r and source plug 186s may be equal to first width Wa. Alternatively, upper plugs 186a, 186b and 186r and source plug 186s may have a width range between first width Wa and second width Wb.

A plurality of bit lines 190 and a source interconnection 191s are formed on second interlayer insulating layer 185 in memory region 50. One of bit lines 190 is connected to the top surface of one of bit line plugs 185. Bit lines 190 cross over gate lines 150g, 150c and 150s, and source line 170s. Bit lines 190 are arranged in parallel and they are spaced apart from each other. In addition, bit lines 190 are in parallel with string active regions 103, and are disposed over corresponding string active regions 103.

Source interconnection 191s is formed in parallel with bit line 190, and connected to the top surface of source plug 186s. Source interconnection 191s is separated from bit line 190. Source interconnection 191s crosses over gate lines 150g, 150c and 150s, and source line 170s. Bit line 190 is formed of a conductive material. For example, bit line 190 preferably comprises at least one material selected from a group consisting of doped polysilicon, a metal such as tungsten or molybdenum, a conductive metal nitride such as titanium nitride or tantalum nitride, and a metal silicide such as tungsten silicide or cobalt silicide.

A peripheral interconnection 191a and a peripheral gate interconnection 191b are disposed on second interlayer insulating layer 175 in peripheral region 60. Peripheral interconnection 191a and peripheral gate interconnection 191b are separated from each other. Peripheral interconnection 191a is connected to the top surface of peripheral upper plug 186a. Various kinds of operating voltages applied to peripheral interconnection 191a are supplied to peripheral source/drain regions 155p via peripheral upper and lower plugs 186a and 170a. Peripheral gate interconnection 191b is connected to the top surface of peripheral gate upper plug 186a. Various kinds of operating voltages applied to peripheral gate interconnection 191b are supplied to the peripheral gate electrode via the peripheral gate upper and lower plugs 186b and 170b. Peripheral interconnection 191a and peripheral gate interconnection 191b are preferably formed of the same material as bit line 190.

A resistor interconnection 191r is disposed on second interlayer insulating layer 175 in resistor region 70. Resistor interconnection 191r is connected to the top surface of resistor upper plug 186r. Accordingly, resistor interconnection 191r is electrically connected to resistor pattern 140r via resistor upper and lower plugs 186r and 170r. Resistor interconnection 191r is preferably formed of the same material as bit line 190.

In the NAND type nonvolatile memory device illustrated in FIG. 1 and FIGS. 2A and 2B and described above, in order to electrically connect peripheral source/drain regions 155p and peripheral interconnection 191a to each other, peripheral lower and upper plugs 170a and 186a are interposed between peripheral source/drain region 155p, and peripheral interconnection 191a. That is, since a contact structure for connecting peripheral interconnection 191a to peripheral source/drain regions 155p is divided into peripheral lower and upper plugs 170a and 186a, the respective heights of the peripheral lower and upper plugs 170a and 186a are reduced. As a result, both the peripheral lower and upper plugs 170a and 186a can be formed with desired shapes. For example, the top surface of peripheral upper plug 186 can be controlled to prevent peripheral upper plug 186a from being shorted with other neighboring conductors.

Similarly, peripheral gate lower and upper plugs 170b and 186b are sequentially stacked between peripheral gate interconnection 191b and the peripheral gate electrode so that peripheral gate lower and upper plugs 170b and 186b can be formed with desired shapes. In addition, resistor lower and upper plugs 170r and 186r are sequentially stacked between resistor interconnection 191r and resistor pattern 140r, and thus it is possible to form resistor lower and upper plugs 170r and 186r with desired shapes.

Meanwhile, bit line plug 185 successively penetrates second and first interlayer insulating layers 175 and 160. That is, one plug is interposed between bit line 190 and common drain region 155d. Bit line plug 185 has a width that depends on the width of string active region 103, which can be formed to a minimum linewidth. Accordingly, it is preferable that bit line plug 185 penetrates second and first interlayer insulating layers 175 and 160 as a single structure. Therefore, bit line plug 185 may have the width of the minimum linewidth.

Where bilayered plugs are stacked between bit line 190 and common drain region 155d, a plane area of the bilayered plugs is increased because the alignment margin between the bilayered plugs cannot be secured. As a result, the width of string active region 103 is increased so that it is difficult to highly integrate the NAND type flash memory device.

However, in selected embodiments of the invention as described above, since bit line plug 185 connects bit line 190 to common drain region 155d, bit line plug 185 may have the width of the minimum linewidth. Accordingly, string active region 103 is formed such that it has the width of minimum linewidth, and thus it is possible to form the NAND type nonvolatile memory device with ultra-high integration.

A method of forming a NAND type nonvolatile memory device according to selected embodiments of the invention is described below with reference to FIGS. 3 through 6. In particular, FIGS. 3A through 6A are sectional views taken along lines I-I', II-II' and III-III' in FIG. 1 and illustrating a method of forming a NAND type flash memory device according to selected embodiments of the present invention, and FIGS. 3B through 6B are sectional views taken along lines IV-IV', V-V' and VI-VI' of FIG. 1 and illustrating a method of forming a NAND type flash memory device according to selected embodiments of the present invention.

Figure 3A:
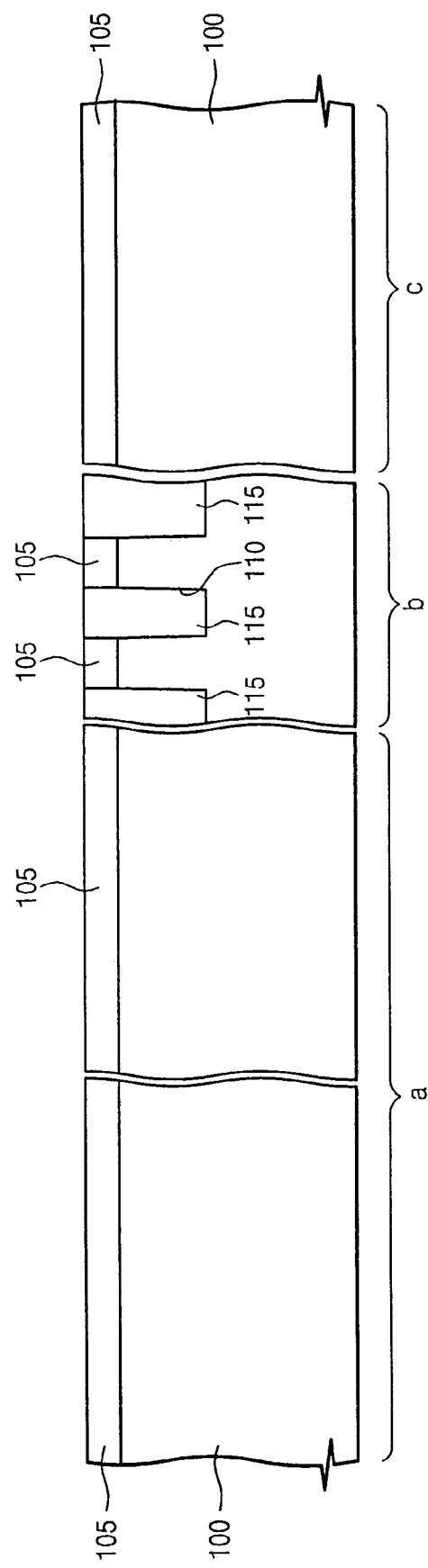
FIGS. 3A, 4A, 5A, and 6A are sectional views taken along lines I-I', II-II' and III-III' in FIG. 1, respectively, and illustrating methods of forming a NAND type flash memory device according to selected embodiments of the present invention.
Figure 3B:
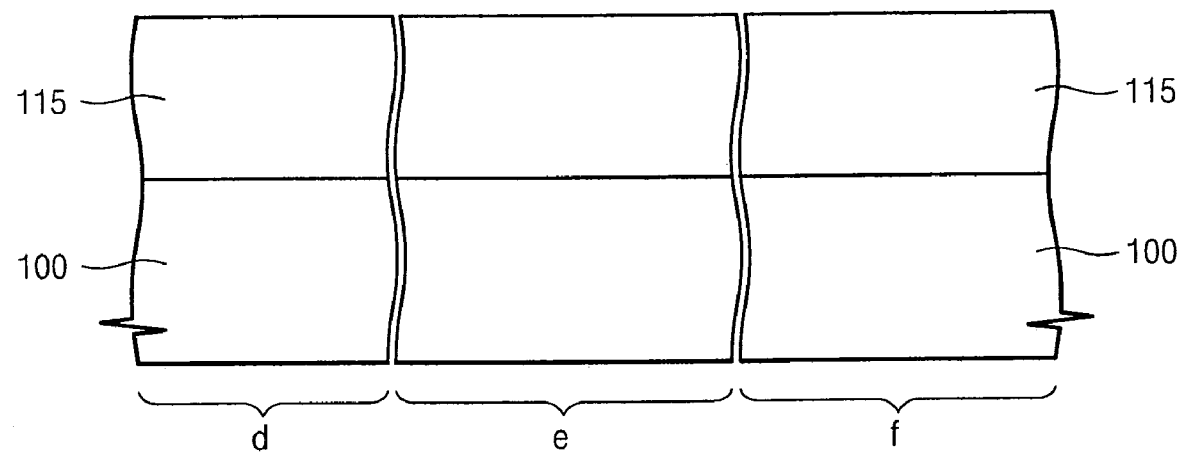
FIGS. 3B, 4B, 5B, and 6B are sectional views taken along lines IV-IV', V-V' and VI-VI' in FIG. 1, respectively, and illustrating methods of forming a NAND type flash memory device according to selected embodiments of the present invention.

Referring to FIG. 1 and FIGS. 3A and 3B, a hard mask pattern 105 is formed on substrate 100 including memory region 50, peripheral region 60 and resistor region 70. Hard mask pattern 105 comprises a material having an etch selectivity relative to substrate 100. For instance, hard mask pattern typically comprises a nitride or an oxynitride. To buffer a stress exerted on substrate 100, hard mask pattern 105 may be formed with a stack structure in which an oxide layer and a nitride layer are stacked in sequence.

Substrate 100 is etched to form a trench 110 using hard mask pattern 105 as a mask. Trench 110 defines a plurality of string active regions 103 in memory region 50, and also defines a peripheral active region 104 in peripheral region 60. Hard mask pattern 105 is disposed on string active region 103 and peripheral active region 104.

Thereafter, a device isolation insulating layer is formed to fill trench 110. The device isolation insulating layer is then planarized until hard mask pattern 105, leaving a device isolation layer 115 filling trench 110. Device isolation layer 115 typically comprises an oxide layer.

Figure 4A:
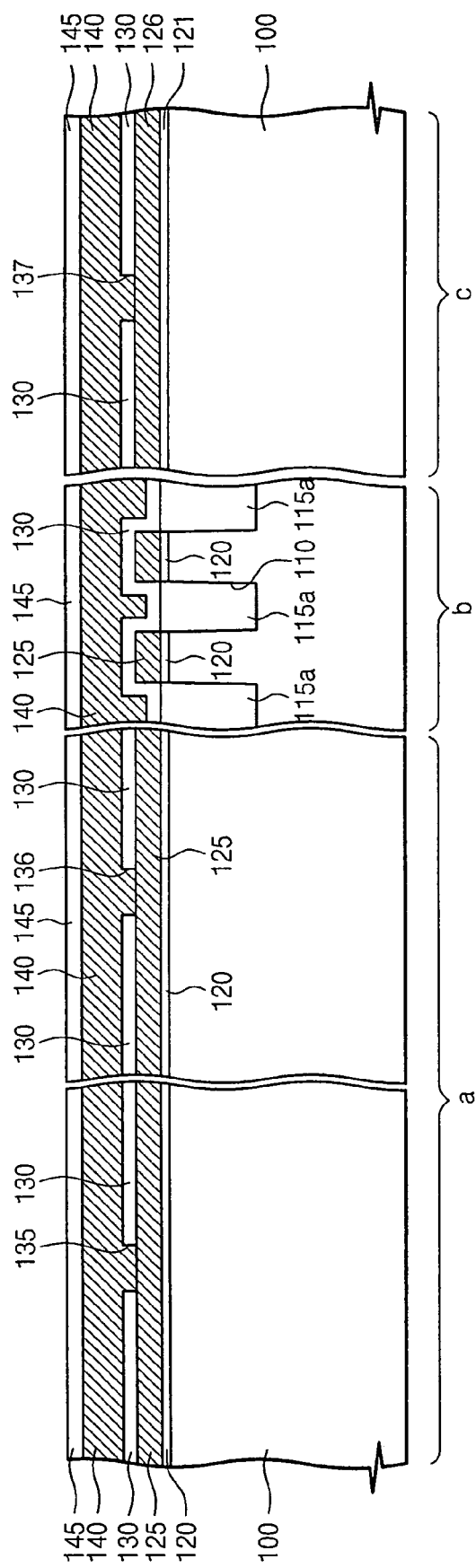
Figure 4B:
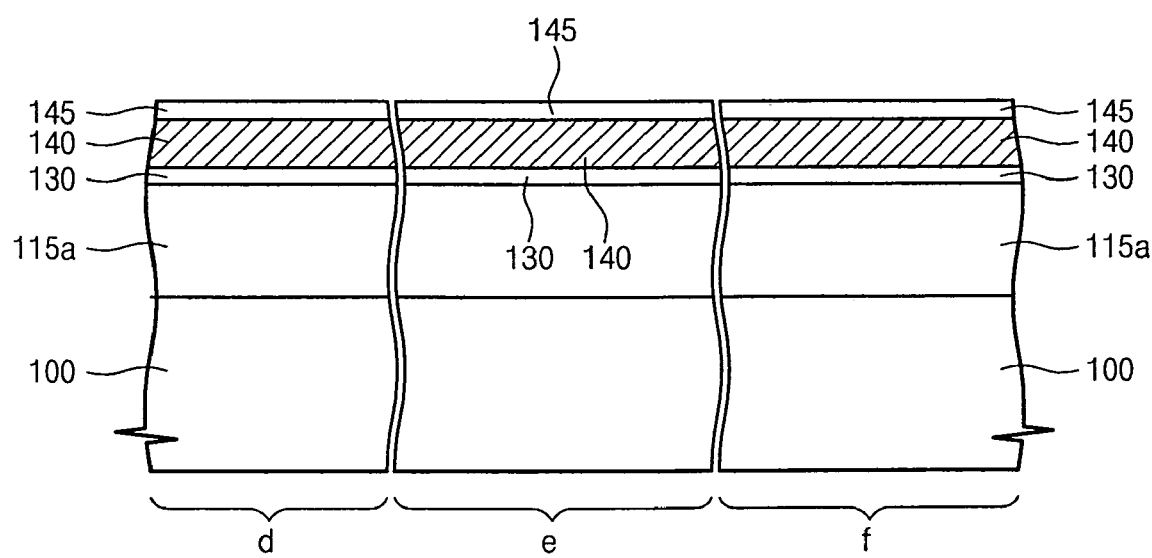

Referring to FIG. 1 and FIGS. 4A and 4B, hard mask pattern 110 is removed, exposing top surfaces of string active region 103 and peripheral active region 104 and forming a cavity region surrounded by a portion of device isolation layer 115 protruding above a top surface of substrate 100. The cavity region surrounded by the protruding portion of device isolation layer 115 in memory region 50 is defined as a first cavity region, and the cavity region surrounded by the protruding portion of device isolation layer 115 in peripheral region 60 is defined as a second cavity region. In resistor region 70, only device isolation layer 115 may be formed.

A first gate insulating layer 120 is formed on the top surface of string active region 103, and a second gate insulating layer 121 is formed on the top surface of peripheral active region 104. First and second gate insulating layers 120 and 121 preferably comprise an oxide such as a thermal oxide. Where a transistor formed in peripheral region 60 is a high voltage transistor, second gate insulating layer 121 is formed thicker than first gate insulating layer 120. In this case, after forming the second gate insulating layer 121 on both the string active region 103 and peripheral active region 104, second gate insulating layer 121 on string active region 103 is removed. Subsequently, first gate insulating layer 120 is formed on string active region 103. Alternatively, where the transistor formed in the peripheral region 60 is a low voltage transistor, first and second gate insulating layers 120 and 121 are formed with substantially the same thickness. In this case, first and second gate insulating layers 120 and 121 are formed at the same time.

A first gate conductive layer is formed on an entire surface of substrate 100 having first and second gate insulating layers 120 and 121 such that the first and second cavity regions are filled with the first gate conductive layer. The first gate conductive layer is planarized until device isolation layer 115 is exposed to thereby form a memory gate pattern 125 filling the first cavity region and a peripheral gate pattern 126 filling the second cavity region. Preferably, the first gate conductive layer comprises polysilicon.

Afterwards, the top surface of device isolation layer 115 is recessed to expose sidewalls of memory and peripheral gate patterns 125 and 126. The top surface of recessed device isolation layer 115a may be as high as bottom surfaces of memory and peripheral gate patterns 125 and 126. Recessed device isolation layer 115a preferably covers side surfaces of first and second gate insulating layers 120 and 121. The top surface of device isolation layer 115a is also exposed in resistor region 70.

Thereafter, a blocking insulating layer 130 is conformally formed on an entire surface of substrate 100. Blocking insulating layer 130 typically comprises an oxide layer thicker than first gate insulating layer 120. Alternatively, blocking insulating layer 130 may comprise an ONO layer. In another alternative, blocking insulating layer 130 may comprise a high dielectric layer having a higher dielectric constant than first gate insulating layer 120. For example, blocking insulating layer 130 may comprise an insulating metal oxide layer such as a hafnium oxide layer or an aluminum oxide layer.

Blocking insulating layer 130 is patterned to form first and second select openings 135 and 136 exposing memory gate patterns 125, and a peripheral opening 137 exposing peripheral gate pattern 126. First and second select openings 135 and 136 are formed in a region where the first and second select gate electrodes will be formed. Peripheral opening 137 is formed in a region where the peripheral gate electrode will be formed.

A second gate conductive layer 140 is formed on an entire surface of the substrate having openings 135, 136 and 137. Second gate conductive layer 140 fills openings 135, 136 and 137 so that it is connected to the memory and peripheral gate patterns 125 and 126. A capping layer 145 may be formed on second gate conductive layer 140. Capping layer 145 may be formed of an insulating material.

Figure 5A:
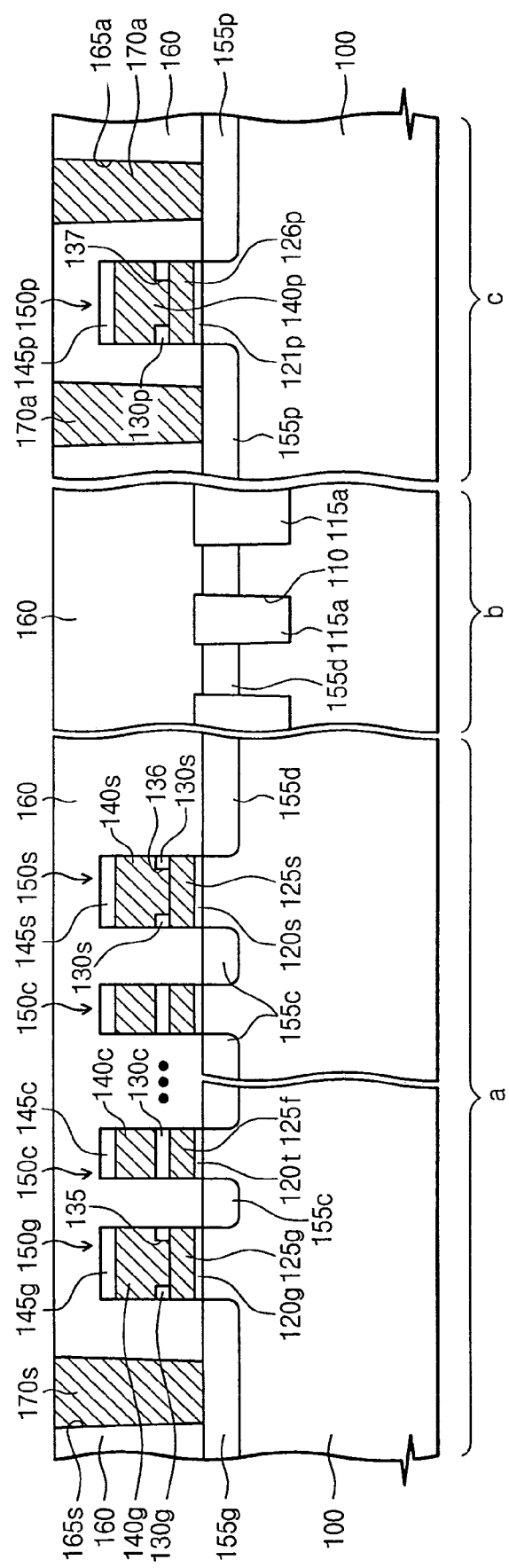
Figure 5B:
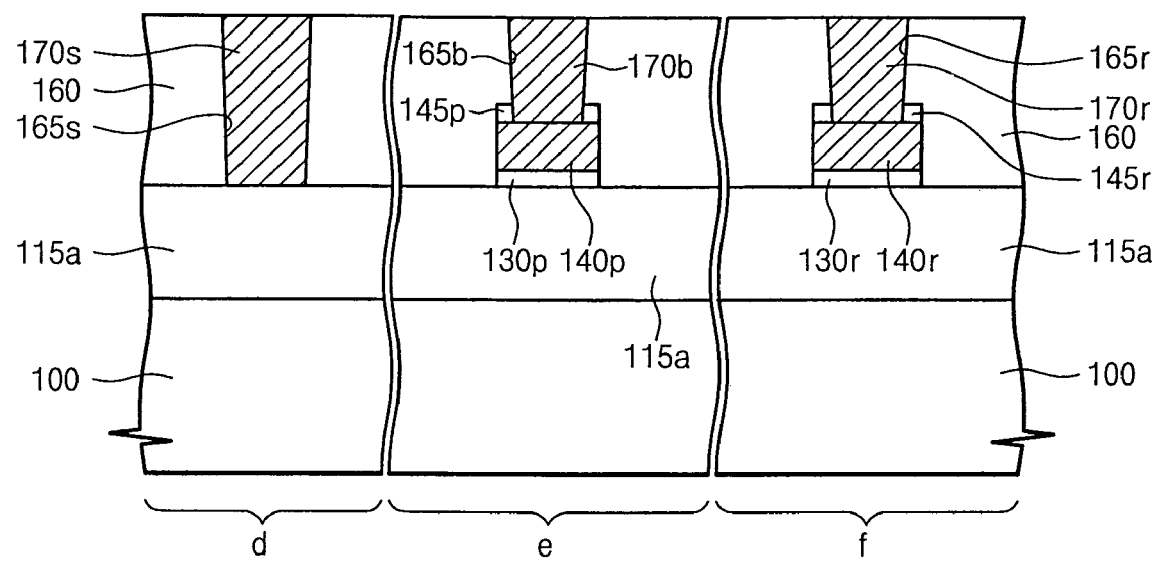

Referring to FIG. 1 and FIGS. 5A and 5B, capping layer 145, second gate conductive layer 140, blocking insulating layer 130, memory gate pattern 125, and first gate insulating layer 120 are sequentially patterned in memory region 50 to form first select gate line 150g, cell gate lines 150c and second select gate line 150s. Capping layer 145, second gate conductive layer 140, blocking insulating layer 130, peripheral gate pattern 126 and second gate insulating layer 121 are sequentially patterned in the peripheral region to form peripheral gate pattern 150p. Capping layer 145, second gate conductive layer 140, and blocking insulating layer 130 are sequentially patterned in resistor region 70 to form resistor interlayer pattern 130r, resistor pattern 140r and resistor capping pattern 145, which are stacked in sequence. Preferably, gate lines 150g, 150c and 150s and resistor pattern 140r are formed at the same time.

Gate lines 150g, 150c and 150s, peripheral gate pattern 150p and resistor pattern 140r are identical to those elements illustrated with reference to FIG. 1 and FIGS. 2A and 2B. A first select lower gate 125g, a floating gate 125f, and a second select lower gate 125s are formed from portions of memory gate pattern 125. A peripheral lower gate 126p is formed from a portion of peripheral gate pattern 126. First select interlayer pattern 130g, blocking insulating pattern 130c, second select interlayer pattern 130s, peripheral interlayer pattern 130p and resistor interlayer pattern 130r are formed from portions of the blocking insulating layer 130. First select upper gate 140g, control gate electrode 140c, second select upper gate 140s, peripheral upper gate 140p and resistor pattern 140r are formed from portions of second gate conductive layer 140. First select, cell, second select, peripheral and resistor capping patterns 145g, 145c, 145s, 145p and 145r are formed from portions of the capping layer 145. Peripheral gate insulating layer 121p is formed from a portion of second gate insulating layer 121.

First dopant ions are implanted into string active region 103 using first and second select gate lines 150g and 150s and cell gate lines 150c as a mask, thereby forming common source region 155g, cell source/drain regions 155c and common drain region 155d. Common source region 155g, cell source/drain regions 155c and common drain region 155d are formed at the same time. Second dopant ions are implanted into peripheral active region 104 using peripheral gate pattern 150p as a mask, to form peripheral source/drain regions 155p. Where cell source/drain region 155c and peripheral source/drain region 155p are doped with the same type dopants, cell and peripheral source/drain regions 155c and 155p may be formed at the same time. Alternatively, where cell and peripheral source/drain region 155c and 155p are doped with dopants having different types, cell and peripheral source/drain regions 155c and 155p are sequentially formed regardless of an order.

Subsequently, gate spacers (not shown) may be formed on sidewalls of gate lines 150g, 150c and 150s, peripheral gate pattern 150p, and resistor pattern 140r, respectively.

First interlayer insulating layer 160 is formed to cover an entire surface of substrate 100. First interlayer insulating layer 160 in memory region 50 is patterned to form source groove 165g crossing over string active regions 103 and exposing common source regions 155g. First interlayer insulating layer 160 and peripheral capping pattern 145p in peripheral region 60 are sequentially patterned to form peripheral lower contact hole 165a exposing peripheral source/drain regions 155p, and peripheral gate lower contact hole 165b exposing the peripheral gate electrode, or more specifically, peripheral upper gate 140p.

First insulating layer 160 and resistor capping pattern 145r in resistor region 70 are sequentially patterned to form resistor lower contact hole 165r exposing resistor pattern 140r. Preferably, source groove 165s, peripheral lower contact hole 165a, peripheral gate lower contact hole 165b, and resistor lower contact hole 165r are simultaneously formed. Widths of uppermost portions of peripheral gate lower contact hole 165b and resistor lower contact hole 165r may be equal to width W1 of an uppermost portion of peripheral lower contact hole 165a. The width of source groove 165s may be equal to width W1. According to circumstances, the lower contacts holes 165a, 165b and 165r may have different widths.

The sidewalls of source groove 165s are preferably tapered. In other words, the width of source groove 165s preferably decreases in a downward direction. Similarly, the sidewalls of peripheral lower contact hole 165a are preferably, or in other words, the width of peripheral lower contact hole 165a decreases in a downward direction. The sidewalls of peripheral gate lower contact hole 165b and resistor lower contact hole 165r are also preferably tapered similar to peripheral lower contact hole 165a.

A conductive layer is formed to fill source groove 165s and lower contact holes 165a, 165b and 165r. The conductive layer is then planarized until first interlayer insulating layer 160 is exposed. Thus, source line 170s is formed in source groove 165a, and lower plugs 170a, 170b and 170r are formed in contact holes 165a, 165b and 165r, respectively. In other words, peripheral lower plug 170a, peripheral gate lower plug 170b, and resistor lower plug 170r fill peripheral lower contact hole 165a, peripheral gate lower contact hole 165b and resistor lower contact hole 165r, respectively.

Figure 6A:
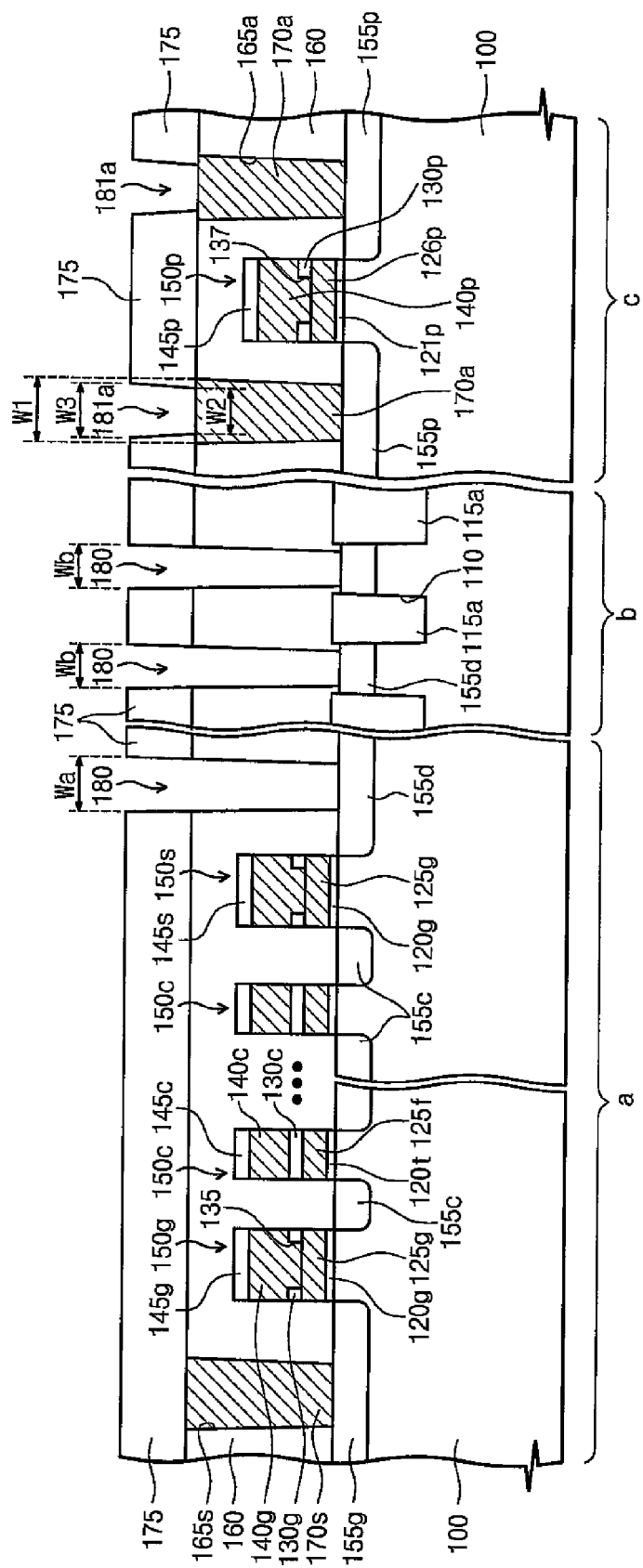
Figure 6B:
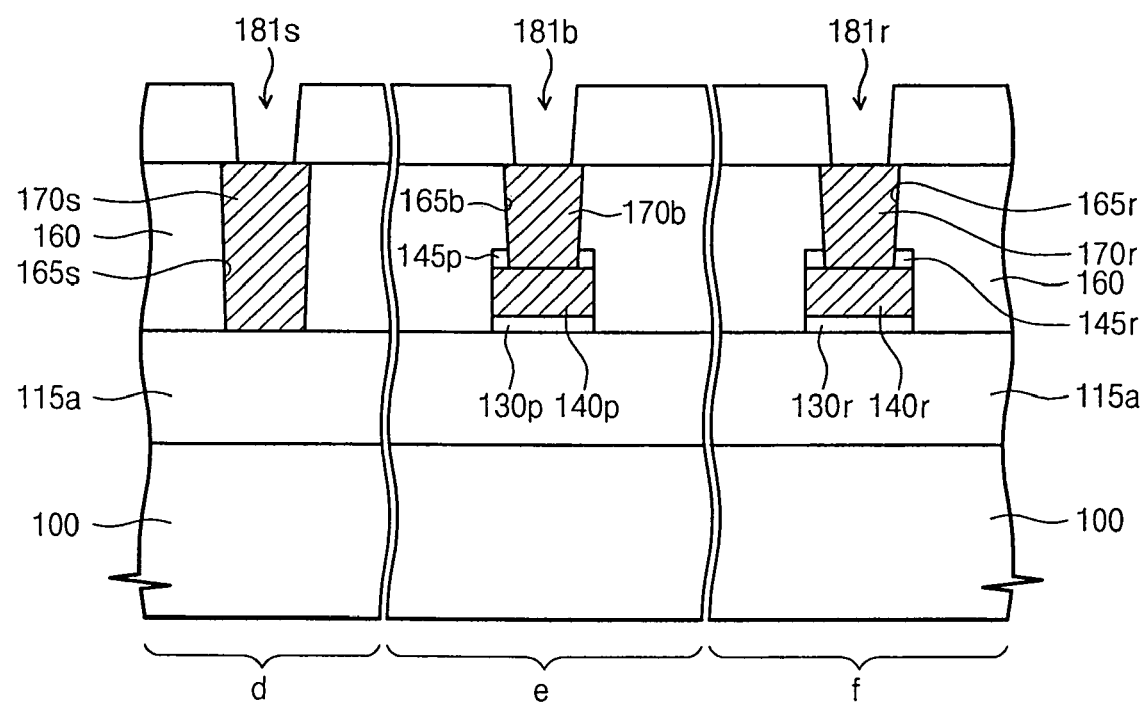

Referring to FIG. 1 and FIGS. 6A and 6B, second interlayer insulating layer 175 is formed on an entire surface of substrate 100 having source line 170s and lower plugs 170a, 170b and 170r.

Second and first interlayer insulating layers 175 and 160 in memory region 50 are successively patterned to form bit line contact hole 180 exposing common drain region 155d. In addition, second interlayer insulating layer 175 in memory region 50 is patterned to form source contact hole 181s exposing source line 170s. Second interlayer insulating layer 175 in peripheral region 60 is patterned to form peripheral upper contact hole 181a and peripheral gate contact hole 181b exposing peripheral lower plug 170a and peripheral gate lower plug 170b, respectively. Second interlayer insulating layer 175 in resistor region 70 is patterned to form resistor upper contact hole 181r exposing resistor lower plug 170r. Preferably, bit line contact hole 180, source contact hole 181s, and upper contact holes 181a, 181b and 181r are all formed simultaneously.

An uppermost portion of bit line contact hole 180 has a first width Wa as measured along the first direction in which string active regions 103 extend, and a second width Wb as measured along the second direction, which is perpendicular to the first direction. Preferably, first width Wa is greater than second width Wb. Second width Wb varies with the width of string active region 103. Preferably, the width of bit line contact hole 180 decreases in a downward direction. Accordingly, the width of a lowermost portion of bit line contact hole 180, i.e., particularly, a width corresponding to second width Wb, is smaller than the width of string active region 103. As a result, even though second width Wb and the width of the string active region are a minimum linewidth, it is possible to secure the alignment margin between bit line contact hole 180 and common drain region 155d. Since first width Wa is greater than second width Wb, bit line contact hole 180 can increase an exposed area of common drain region 155d.

Preferably, width W2 of a lowermost portion of peripheral upper contact hole 181a is smaller than width W1 of the uppermost portion of the peripheral lower contact hole 165a. Accordingly, it is possible to secure the alignment margin between peripheral upper contact hole 181a and peripheral lower plug 170a. Width W3 of the uppermost portion of peripheral upper contact hole 181a may be equal to or smaller than width W1 of the uppermost portion of peripheral lower contact hole 165a. In particular, it is preferable that width W3 of the uppermost portion of peripheral upper contact hole 181a is smaller than width W1 of the uppermost portion of peripheral lower contact hole 165a. The sidewalls of peripheral upper contact hole 181a are also preferably tapered similar to bit line contact hole 180.

Preferably, second width Wb of the uppermost portion of bit line contact hole 180 is smaller than width W1 of the uppermost portion of peripheral lower contact hole 165a. First width Wa of the uppermost portion of bit line contact hole 180 may be smaller than or equal to width W1 of the uppermost portion of peripheral lower contact hole 165a. Alternatively, first width Wa of the uppermost portion of bit line contact hole 180 may be greater than width W1 of the uppermost portion of peripheral lower contact hole 165a so as to increase an area of common drain region 155d exposed by bit line contact hole 180.

Preferably, the width of the lowermost portion of source contact hole 181s is smaller than the width of the top surface of source line 170s. Similarly, it is preferable that the width of the lowermost portion of the peripheral gate upper contact hole 181b is smaller than the width of the uppermost portion of peripheral gate lower contact hole 165a. Preferably, the width of the lowermost portion of resistor upper contact hole 181r is smaller than the width of the uppermost portion of resistor lower contact hole 165r. Accordingly, it is possible to secure the alignment margin. The width of the uppermost portion of source contact hole 181s may be smaller than or equal to the width of the top surface of source line 170s. The width of the uppermost portion of peripheral gate upper contact hole 181b is smaller than or equal to the width of the top surface of peripheral gate lower plug 170b. The width of the uppermost portion of the resistor upper contact hole 181r is smaller than or equal to the width of the top surface of resistor lower plug 170r.

A conductive layer is formed on an entire surface of substrate 100 such that it fills contact holes 180, 191s, 181a, 181b and 181r. Thereafter, the conductive layer is planarized until second interlayer insulating layer 175 is exposed, and thus plugs 185, 186s, 186a, 186b and 186r are formed, as illustrated in FIGS. 2A and 2B. Subsequently, bit line 190 and other interconnections 191s, 191a, 191b and 191r are formed on second interlayer insulating layer 175, as illustrated in FIGS. 2A and 2B. Thus, it is possible to realize the NAND type nonvolatile memory device of FIGS. 2A and 2B.

According to the method of forming the NAND type nonvolatile memory device, the hole with a relatively great width exposing peripheral active region 104 is formed such that it is divided into peripheral lower contact hole 165a and peripheral upper contact hole 181a. Accordingly, a shape of a plug structure, i.e., shapes of peripheral lower and upper plugs 170a and 186a that are connected to peripheral source/drain regions 155p, may be beneficially adjusted. In addition, bit line contact hole 180 with a relatively small width is formed by successively patterning the second and first interlayer insulating layers 175 and 160. Thus, it is possible to beneficially adjust the shape of bit line plug 185 filling bit line contact hole 180.

In addition, since the lower contact holes 165a, 165b and 165r are simultaneously formed with source groove 165s, and upper contact holes 181a, 181b and 181r are simultaneously formed with bit line contact hole 180, an additional process is not required. Therefore, it is possible to improve a productivity of the NAND type flash memory device.

As described above, according to selected embodiments of the invention, the bit line contact hole having a relatively small width is formed to penetrate the second and first interlayer insulating layers successively, and the hole having the relatively great width that is formed the peripheral region and/or the resistor region is separately formed into the lower and upper contact holes. Accordingly, it is possible to optimally realize the bit line contact hole and the holes formed in the peripheral region and/or the resistor region. As a result, it is possible to from the NAND type flash memory device with ultra-high integration, and further minimize failures of the NAND type flash memory device with ultra-high integration.

The foregoing exemplary embodiments are teaching examples. Those of ordinary skill in the art will understand that various changes in form and details may be made to the exemplary embodiments without departing from the scope of the invention as defined by the following claims.

What is claimed is:

1. A NAND type flash memory device, comprising:
a substrate comprising a memory region and a peripheral region;
a device isolation layer formed in the substrate to define a string active region extending in a first direction within the memory region and to define a peripheral active region extending in the first direction within the peripheral region;
a common source region and a common drain region formed in the string active region, wherein the common source region and the drain region are separated from each other;
a first insulating layer formed on the substrate and having a source groove;
a source line filling the source groove, the source line being connected to the common source region;
a peripheral lower plug penetrating the first insulating layer and connected to the peripheral active region;
a second insulating layer covering an entire surface of the substrate;
a peripheral upper plug penetrating the second insulating layer and connected to the peripheral lower plug; and
a bit line plug filling a bit line contact hole sequentially penetrating the second and first insulating layers and connected to the common drain region, wherein the bit line plug has a top surface with a first width along the first direction and a second width, the second width is perpendicular to the first width, and the first width is greater than the second width, and
the peripheral lower plug has a top surface with a width greater than the second width of the top surface of the bit line plug.

2. The NAND type flash memory device of claim 1, wherein the peripheral upper plug has a bottom surface with a width smaller than a width of a top surface of the peripheral lower plug.

3. The NAND type flash memory device of claim 1, further comprising:
a bit line formed on the second insulating layer and connected to a top surface of the bit line plug, wherein the bit line is arranged in parallel with the string active region; and
a peripheral interconnection formed on the second insulating layer and connected to a top surface of the peripheral upper plug.

4. The NAND type flash memory device of claim 1, further comprising:
a first select gate line and a second select gate line arranged in parallel with each other and crossing over the string active region between the common source region and the common drain region, wherein the first and second select gate lines are adjacent to the common source region and the common drain region, respectively;
a plurality of cell gate lines arranged in parallel with each other and crossing over the string active region between the first and second select gate lines;
cell source and drain regions formed in the string active region on respective opposing sides of each of the plurality of cell gate lines;
a peripheral gate pattern crossing over the peripheral active region; and
peripheral source and drain regions formed in the peripheral active region on respective opposing sides of each of the peripheral gate pattern,
wherein the first insulating layer covers the first select cell gate line, the second select cell gate line, and the peripheral gate pattern, and the peripheral lower plug is connected to one of the peripheral source and drain regions.

5. The NAND type flash memory device of claim 4, wherein the peripheral gate pattern comprises a peripheral gate electrode, the device further comprising:
a peripheral gate lower plug penetrating the first insulating layer and connected to the peripheral gate electrode;
a peripheral gate upper plug penetrating the second insulating layer and connected to the peripheral gate lower plug; and
a peripheral gate interconnection formed on the second insulating layer and connected to the top surface of the peripheral gate upper plug.

6. The NAND type flash memory device of claim 5, wherein the peripheral gate upper plug has a bottom surface with a width smaller than a width of a top surface of the peripheral gate lower plug.

7. The NAND type flash memory device of claim 5, wherein the peripheral gate pattern comprises:
a peripheral upper gate crossing over the peripheral active region;
a peripheral lower gate interposed between the peripheral upper gate and the peripheral active region;
a peripheral gate insulating layer interposed between the peripheral lower gate and the peripheral active region; and
a peripheral interlayer pattern interposed between the peripheral upper gate and the peripheral lower gate,
wherein the peripheral upper gate fills a peripheral opening penetrating the peripheral interlayer pattern and is connected to the peripheral lower gate; and
wherein the peripheral gate upper plug is connected to a top surface of the peripheral upper gate.

8. The NAND type flash memory device of claim 1, wherein the substrate further comprises a resistor region, the device further comprising:
a resistor pattern formed between the device isolation layer and the first insulating layer in the resistor region;
a resistor lower plug penetrating the first insulating layer and connected to a top surface of one end of the resistor pattern;
a resistor upper plug penetrating the second insulating layer and connected to the resistor lower plug; and
a resistor interconnection formed on the second insulating layer and connected to a top surface of the resistor upper plug.

9. The NAND type flash memory device of claim 8, wherein a width of a bottom surface of the resistor upper plug is smaller than a width of a top surface of the resistor lower plug.

10. A NAND type flash memory device, comprising:
a substrate comprising a memory region and a peripheral region;
a device isolation layer formed in the substrate to define a string active region extending in a first direction within the memory region and to define a peripheral active region extending in the first direction within the peripheral region;
a common source region and a common drain region formed in the string active region, wherein the common source region and the drain region are separated from each other;
a first insulating layer formed on the substrate and having a source groove;
a source line filling the source groove, the source line being connected to the common source region;
a peripheral lower plug penetrating the first insulating layer and connected to the peripheral active region;
a second insulating layer covering an entire surface of the substrate;
a peripheral upper plug penetrating the second insulating layer and connected to the peripheral lower plug; and
a bit line plug filling a bit line contact hole sequentially penetrating the second and first insulating layers and connected to the common drain region, wherein the bit line plug has a top surface with a first width along the first direction and a second width, the second width is perpendicular to the first width, and the first width is greater than the second width, and
wherein the peripheral lower plug has a top surface with a width less than the first width of the top surface of the bit line plug.

11. The NAND type flash memory device of claim 10, wherein the peripheral upper plug has a bottom surface with a width smaller than a width of a top surface of the peripheral lower plug.

12. The NAND type flash memory device of claim 10, further comprising:
a bit line formed on the second insulating layer and connected to a top surface of the bit line plug, wherein the bit line is arranged in parallel with the string active region; and
a peripheral interconnection formed on the second insulating layer and connected to a top surface of the peripheral upper plug.

13. The NAND type flash memory device of claim 10, further comprising:
a first select gate line and a second select gate line arranged in parallel with each other and crossing over the string active region between the common source region and the common drain region, wherein the first and second select gate lines are adjacent to the common source region and the common drain region, respectively;
a plurality of cell gate lines arranged in parallel with each other and crossing over the string active region between the first and second select gate lines;
cell source and drain regions formed in the string active region on respective opposing sides of each of the plurality of cell gate lines;
a peripheral gate pattern crossing over the peripheral active region; and
peripheral source and drain regions formed in the peripheral active region on respective opposing sides of each of the peripheral gate pattern,
wherein the first insulating layer covers the first select cell gate line, the second select cell gate line, and the peripheral gate pattern, and the peripheral lower plug is connected to one of the peripheral source and drain regions.

14. The NAND type flash memory device of claim 13, wherein the peripheral gate pattern comprises a peripheral gate electrode, the device further comprising:
a peripheral gate lower plug penetrating the first insulating layer and connected to the peripheral gate electrode;
a peripheral gate upper plug penetrating the second insulating layer and connected to the peripheral gate lower plug; and
a peripheral gate interconnection formed on the second insulating layer and connected to the top surface of the peripheral gate upper plug.

15. The NAND type flash memory device of claim 14, wherein the peripheral gate upper plug has a bottom surface with a width smaller than a width of a top surface of the peripheral gate lower plug.

16. The NAND type flash memory device of claim 14, wherein the peripheral gate pattern comprises:
a peripheral upper gate crossing over the peripheral active region;
a peripheral lower gate interposed between the peripheral upper gate and the peripheral active region;
a peripheral gate insulating layer interposed between the peripheral lower gate and the peripheral active region; and a peripheral interlayer pattern interposed between the peripheral upper gate and the peripheral lower gate, wherein the peripheral upper gate fills a peripheral opening penetrating the peripheral interlayer pattern and is connected to the peripheral lower gate; and wherein the peripheral gate upper plug is connected to a top surface of the peripheral upper gate.

17. The NAND type flash memory device of claim 10, wherein the substrate further comprises a resistor region, the device further comprising:

a resistor pattern formed between the device isolation layer and the first insulating layer in the resistor region;

a resistor lower plug penetrating the first insulating layer and connected to a top surface of one end of the resistor pattern;

a resistor upper plug penetrating the second insulating layer and connected to the resistor lower plug; and a resistor interconnection formed on the second insulating layer and connected to a top surface of the resistor upper plug.

18. The NAND type flash memory device of claim 17, wherein a width of a bottom surface of the resistor upper plug is smaller than a width of a top surface of the resistor lower plug.

* * * * *